(12) United States Patent
Marques

(10) Patent No.: US 8,162,005 B2
(45) Date of Patent: Apr. 24, 2012

(54) DURABLE FRIT COMPOSITION AND COMPOSITES AND DEVICES COMPRISED THEREOF

(75) Inventor: Paulo Gaspar Jorge Marques, Fontainebleau (FR)

(73) Assignee: Corning Incorporated, Corning, NY (US)

(*) Notice: Subject to any disclaimer, the term of this patent is extended or adjusted under 35 U.S.C. 154(b) by 671 days.

(21) Appl. No.: 12/277,009

(22) Filed: Nov. 24, 2008

(65) Prior Publication Data

US 2009/0139590 A1 Jun. 4, 2009

(30) Foreign Application Priority Data

Nov. 30, 2007 (EP) .................................. 07301613

(51) Int. Cl.
*F15C 1/06* (2006.01)

(52) U.S. Cl. .......... 137/833; 137/597; 251/368; 501/21; 501/17; 501/55; 501/67

(58) Field of Classification Search .................. 137/833, 137/597; 251/368; 501/21, 17, 66, 67
See application file for complete search history.

(56) References Cited

U.S. PATENT DOCUMENTS

| | | | |
|---|---|---|---|
| 3,499,776 A | 3/1970 | Baak et al. | |
| 4,291,107 A | 9/1981 | Barry et al. | 429/104 |
| 4,839,313 A * | 6/1989 | Kondo et al. | 501/14 |
| 5,277,946 A * | 1/1994 | Nagai et al. | 428/426 |
| 5,308,803 A * | 5/1994 | Clifford et al. | 501/17 |
| 5,350,718 A * | 9/1994 | Anquetil et al. | 501/21 |
| 5,605,869 A * | 2/1997 | Mangat et al. | 501/14 |
| 5,637,261 A * | 6/1997 | Mattox | 252/514 |
| 5,827,789 A * | 10/1998 | Tunker et al. | 501/17 |
| 5,849,649 A * | 12/1998 | Poole | 501/26 |
| 5,853,446 A | 12/1998 | Carre et al. | 65/17.3 |
| 5,939,343 A * | 8/1999 | Tunker et al. | 501/17 |
| 6,063,718 A * | 5/2000 | El Khiati et al. | 501/70 |
| 6,171,987 B1 * | 1/2001 | Hormadaly | 501/26 |
| 6,297,182 B1 * | 10/2001 | Maeda et al. | 501/66 |
| 6,595,232 B2 * | 7/2003 | Guzman et al. | 137/15.01 |
| 6,716,275 B1 | 4/2004 | Reed et al. | 96/10 |
| 6,769,444 B2 * | 8/2004 | Guzman et al. | 137/15.01 |
| 6,878,651 B2 * | 4/2005 | Crosbie | 501/5 |
| 7,004,198 B1 * | 2/2006 | Okandan et al. | 137/827 |
| 7,007,709 B2 * | 3/2006 | Guzman et al. | 137/13 |
| 7,008,891 B2 * | 3/2006 | Kobayashi et al. | 501/6 |
| 7,160,823 B2 * | 1/2007 | Park et al. | 501/32 |
| 7,802,591 B2 * | 9/2010 | Barrow et al. | 137/806 |
| 7,871,949 B2 * | 1/2011 | Lee et al. | 501/32 |
| 2003/0228967 A1 * | 12/2003 | Bitossi et al. | 501/10 |
| 2006/0240967 A1 | 10/2006 | Hojaji et al. | 501/33 |
| 2007/0123410 A1 * | 5/2007 | Morena et al. | 501/65 |

(Continued)

FOREIGN PATENT DOCUMENTS

DE    4430710 C1    8/1994

(Continued)

*Primary Examiner* — Stephen M Hepperle
*Assistant Examiner* — Minh Le
(74) *Attorney, Agent, or Firm* — Jason A Barron; Gregory V Bean

(57) ABSTRACT

A zirconium- and alumina-containing silicate glass suitable for use as a frit with refractory materials such as alumina is disclosed, the silicate glass comprising a glass composition in mole percent (mol %) of:
2<$B_2O_3$<7 mol %
75<$SiO_2$<80 mol %
3<$Al_2O_3$<5 mol %
2<$ZrO_2$<5 mol%
9<$Na_2O+K_2O$<15 mol %
0<alkali earth+lanthanide<15 mol %
and wherein the total mole percent of $SiO_2$, $AlO_3$ and $ZrO_2$ together is greater than 82 but less than 86, and wherein the total mole percent of $B_2O_3$, $Na_2O$, $K_2O$, alkali earths and lanthanides together is greater than 13 and less than 18. Frits (200,600), composites (600) and microfluidic devices (12) comprising the glass are also disclosed.

20 Claims, 4 Drawing Sheets

U.S. PATENT DOCUMENTS

2007/0261750 A1 * 11/2007 Nedelec ........................ 137/833

FOREIGN PATENT DOCUMENTS

| | | | |
|---|---|---|---|
| EP | 787524 | A1 * | 8/1997 |
| EP | 0897897 | A1 | 2/1999 |
| EP | 0992462 | B1 | 5/2001 |
| EP | 1231189 | A1 | 8/2002 |
| EP | 1426345 | A1 | 6/2004 |
| JP | 2000-313681 | | 6/1999 |
| WO | WO02/08134 | A1 | 1/2002 |

* cited by examiner

DURABLE FRIT COMPOSITION AND COMPOSITES AND DEVICES COMPRISED THEREOF

PRIORITY

This application claims priority to European Patent Application number 07301613.1, filed Nov. 30, 2007.

FIELD OF THE INVENTION

This invention is directed to chemically durable and crystallization-resistant glass compositions of low softening point (below 900° C.) suitable for forming seals, glazes, and even glass composites and molded structures in conjunction with alumina and other temperature-resistant materials with similar expansion properties, such as, for example, steatite ceramic, molybdenum, tantalum and yttrium. The invention further relates to Sits composed of such glass compositions that are compatible with alumina and suitable for use in the fabrication of alumina-containing components, such as micro-reactor or other micro-fluidic components comprising alumina, as well as to microfluidic devices of various types formed using such glass compositions.

BACKGROUND

Microfluidic devices, broadly understood, and microreactors in particular, are typically devices arranged to take advantage of high surface to volume ratios available in channels or passages of multi-millimeter or sub-millimeter dimensions. Heat and mass transfer rates can become very large as process volumes shrink. Applications range from massively parallel biological screening utilizing very small amounts of reagent, laboratory reaction characterization and parallel catalyst screening to chemical production Particularly for microfluidic devices useful in chemical production applications, chemical durability, heat transfer capability, and pressure resistance or mechanical robustness become key attributes.

SUMMARY OF THE INVENTION

The present invention is directed to a glass material (1) that can produce reliable, robust and hermetic structures through powder processing; (2) that is chemically compatible with alumina ceramic (has no reactions causing glass immiscibility or devitrification) and has good wetting and flow characteristics, particularly with relation to alumina particles or structures, during thermal processing; (3) that is generally inert and that resists a broad range of corrosive environments at both extremes of pH (for synthesis of fine chemicals); (4) that has thermal expansion characteristics compatible with alumina ceramic in order to give low seal stress over the fabrication and working temperature ranges of the product.

An important application of such glass may be understood from the cross-sections of FIGS. 1A-1D, which are cross-sectional views of one type of microfluidic device in process of being assembled.

The present inventor and/or colleagues of the present inventor have previously developed and disclosed microreactors and processes for making microreactors. Such are disclosed, for example, in U.S. Pat. No. 7,007,709, *Microfluidic Device and Manufacture Thereof*, assigned to the assignee of the present application. The most basic features of the disclosed process may be reviewed with reference to FIGS. 1A-1D of the present application.

In FIG. 1A, two substrates 102 and 104 are provided, More may be used if desired. The substrates may have holes or passages formed therethrough, such as the hole 108 through the substrate 104. In FIG. 1B, two layers of flit material, one for each substrate, are positioned or deposited on the substrates and formed into desired shapes. Layer 204 of frit material is deposited on the surface 304 of substrate 104, while layer 202 of frit material is deposited on the surface 302 of substrate 102. The layer 204 has been deposited or formed into a thin flat layer 204a, while the layer 202 has been deposited or formed into a combination of raised ridges or walls 202b and a thin flat layer 202a. In FIG. 1C, substrate 104 is turned over and placed on the substrate 102, with the respective frit layers 202, 204 in contact, The layers 202, 204 are then sintered, together with the substrates 102, 104, so as to adhere the entire assembly together, resulting in a microfluidic device 12 as shown in FIG. 1D. The glass frit softens and flows, or at least deforms and consolidates to some degree, allowing the frit layers 202,204 to become densified and sintered together as shown in FIG. 1D.

Resulting is a microfluidic device 12 comprising a sintered frit 200, a first substrate 102, and a second substrate 104, the sintered frit 200, the first substrate 102 and the second substrate 104 being adhered together to form a one-piece device 12 in which the sintered frit 200 defines at least one recess 250 between the first and second substrates 102, 104.

As disclosed in the above-mentioned U.S. Pat. No. 7,007, 709, the substrates 102, 104 "may be manufactured from materials selected from glasses, glass ceramics, ceramics, metals, semiconductors such as silicon, and/or combinations thereof." Although some progress has been made in using substrates of other materials, the present inventor and colleagues have relied principally on glass substrates to produce microfluidic devices such as device 12 of FIG. 1D. The thermal conductivities of such glass materials are typically in range of 0.9-1.2 W/m/K at room temperature. In order to achieve higher heat transfer capability, alternative substrate materials of higher thermal conductivity are generally desirable. Of various ceramic materials available, alpha alumina is attractive both because such substrates are commercially available at low cost, and because alumina is inert and strongly resistant to chemical attack, and stable in air at high temperatures.

Despite these attractive attributes of alumina and despite the recognition in the above-referenced patent of the potential use of ceramics, successful formation of microfluidic devices using alumina has been difficult. This is in part because, until the present invention, glass frit compositions having a good CTE match to alumina and low softening point have been excessively subject to chemical attack and/or have been prone to devitrification on sintering, and/or have been unable thoroughly wet alumina particles or structures during sintering. The present invention generally overcomes these defects.

The present invention provides a glass powder that can be fully densified through viscous flow without any devitrification or de-wetting of alumina structures or particles. The inventive glass has been successfully used to make multilayered glass structures and to fabricate thermally conductive glass composites. In addition, glasses of the present invention have excellent chemical resistance and are rated in class 1 and A1 in accordance with criteria of normalized tests DIN 12116 and ISO 695, respectively.

As noted above, the present invention is directed to glass compositions (1) that can produce reliable, robust and hermetic structures through powder processing; (2) that are chemically compatible with alumina ceramic (have no reactions causing glass immiscibility or devitrification) and have good wetting and flow characteristics, particularly with relation to alumina particles or structures, during thermal processing; (3) that are generally inert and that resist a broad range of corrosive environments of both pH extremes (for use in synthesis of fine chemicals); and (4) that have thermal expansion characteristics compatible with alumina ceramic in order to give low seal stress over the fabrication and working temperature ranges of the product.

These desirable properties are provided by a zirconium- and alumina-containing silicate glass suitable for use as a frit with refractory materials such as alumina and comprising a glass composition in mole percent (mol %) of:

$2<B_2O_3<7$ mol %
$75<SiO_2<80$ mol %
$3<Al_2O_3<5$ mol %
$2<ZrO_2<5$ mol %
$9<Na_2O+K_2O<15$ mol %
$0<$alkali earth+lanthanide$<15$ mol % and wherein the total mole percent of $SiO_2$, $Al_2O_3$ and $ZrO_2$ together is greater than 82 but less than 86, and wherein the total mole percent of $B_2O3$, $Na_2O$, $K_2O$, alkali earth and lanthanide is greater than 13 and less than 18. The present invention is directed to this material and to frits, composites, and fluidic devices made therefrom or therewith.

The substrates and/or particles, such as aluminum oxide substrates or particles, generally useful in conjunction with the materials of the invention typically have a CTE in the range of $50-85 \times 10^{-7}/°$ C., preferably in the range of 55 to $80 \times 10^{-7}/°$ C. (300° C.), and the materials of the invention are desirably matched to these values, with the glass materials slightly lower in thermal expansion, such the glass remains slightly in compression throughout the desired range of working temperatures.

Additionally, the invention is directed to glasses, and frits made therefrom, having the following compositions:

1. $B_2O_3=3.2\pm1.1$ mol %
   $SiO_2=76.5\pm1.4$ mol %
   $Al_2O_3=3.1-4$ mol %
   $ZrO_2=2.9\pm0.8$ mol %
   $Na_2O 14.4\pm0.5$ mol %
2. $B_2O_3=3.2\pm0.3$ mol %
   $SiO_2=76.5\pm0.7$ mol %
   $Al_2O_3=3.1-3.4$ mol %
   $ZrO_2=2.9\pm0.3$ mol %
   $Na_2O=14.4\pm0.4$ mol %
3. $B_2O_3=5.3\pm1.6$ mol %
   $SiO_2=76.5\pm1.4$ mol %
   $Al_2O_3=3.1-4$ mol %
   $ZrO_2=2.9\pm0.8$ mol %
   $Na_2O=12.3\pm2.6$ mol %

The glass compositions according to the invention are suitable for frit use in that they have no or very minimal tendency to crystallize. Further, the glass compositions according to the present invention have a softening point less than 900° C., desirably even less than 850° C. Low softening point is significantly desirable for several reasons. Lower softening point materials provide important environmental and economic advantages of requiring less energy to process. Further, materials with softening points below 850 or 900 ° C. can generally be sintered, at temperatures in the range of 850-950 ° C., using standard industrial processing equipment, while higher softening points typically require specialized equipment. Still further, a lower softening point increases the range of materials with which the glass composition may be compatible, because maximum processing temperatures and overall processing temperature range are both reduced, lowering the performance requirements for potentially compatible materials. Yet further, softening temperature of less than 900° C., desirably even less than 850° C., allows for sintering temperatures low enough not to cause excessive diffusion of glass constituents and resulting reactions with alumina, but high enough to provide good wetting and only very limited diffusion at the glass-aluminia interface.

DETAILED DESCRIPTION

Figure 1A:
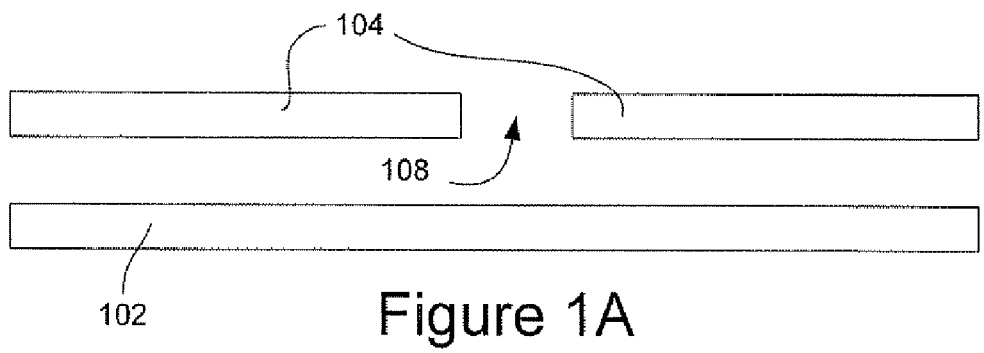
FIGS. 1A-1D are cross sections of a microreactor or microfluidic device in process of being assembled.
Figure 1B:
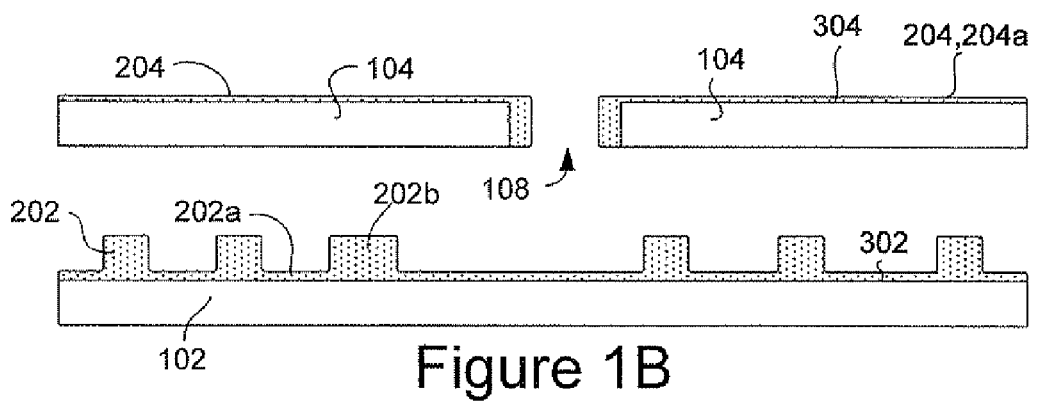
Figure 1C:
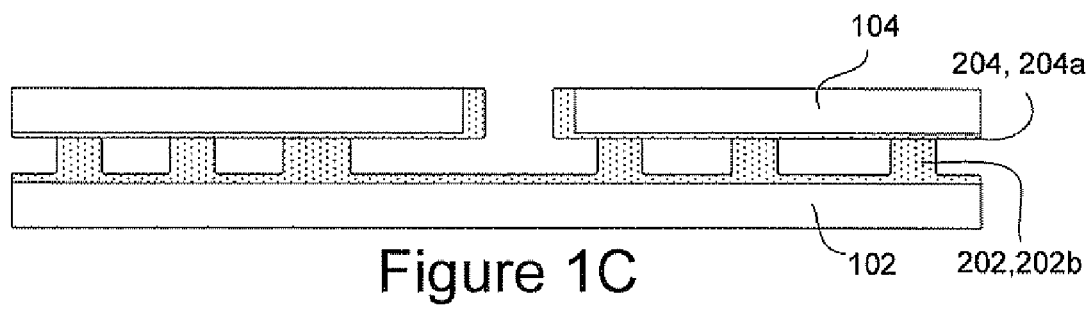
Figure 1D:
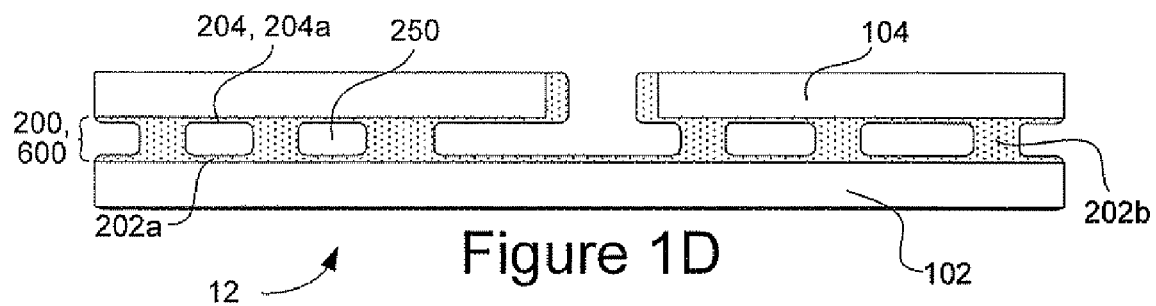

As described above in the Summary of the Invention section, FIGS. 1A-1D represent, in a very general way, the basic steps of fabrication of a microfluidic device or microreactor having frit-based walls sandwiched between substrates 102 and 104. The steps depicted in FIG. 1 may be modified in various ways, such as by including more than just two substrates 102 and 104, or by forming frit walls on both of the facing surfaces in FIG. 1C, so that more complex structures can result. Whether simple or complex, the resulting microfluidic device 12 includes a sintered flit 200, which may be in the form of a sintered flit plus filler forming a composite 600, and a first substrate 102 and a second substrate 104, with the sintered frit 200, the first substrate 102 and the second substrate 104 being adhered together to form a one-piece device 12 in which the sintered frit 200 defines at least one recess 250 between the first and second substrates 102, 104.

Figure 2:
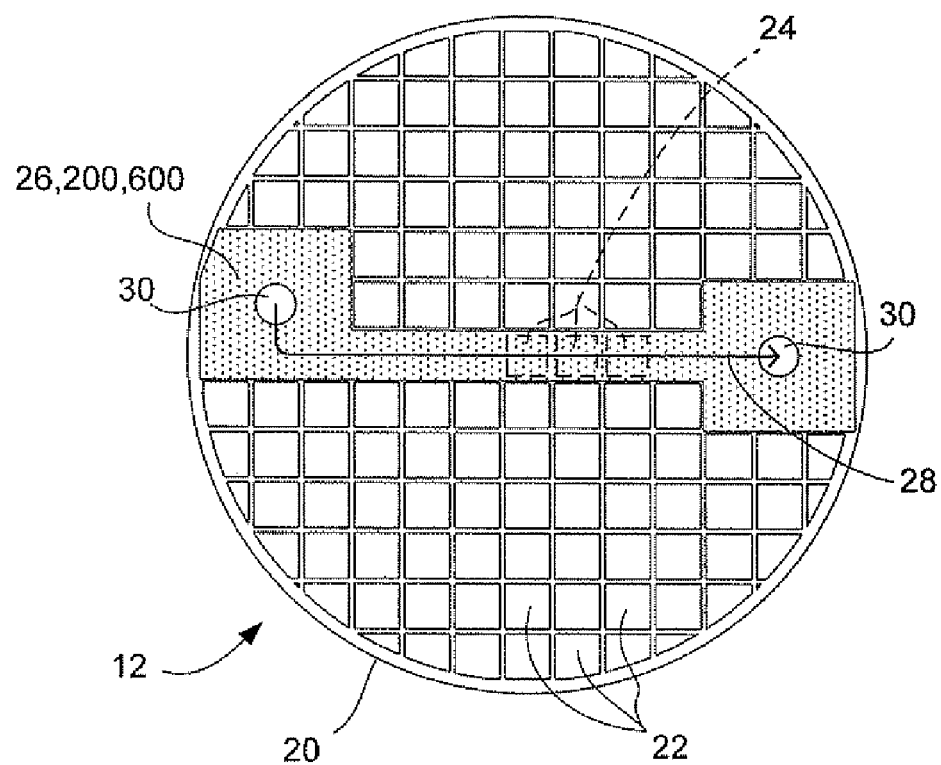
FIG. 2 is a plan view of another type of microfluidic device or microreactor or "minireactor" formed within the cells of an extruded monolith.
Figure 3:
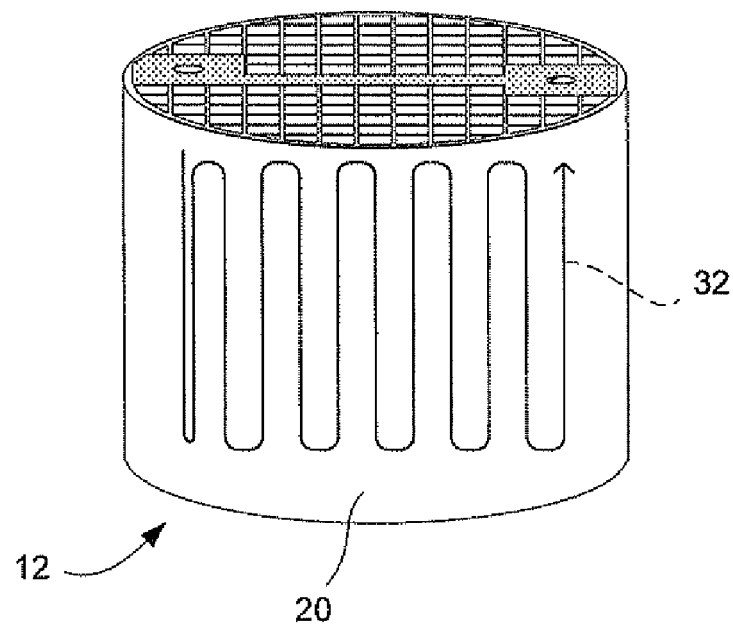
FIG. 3 is a perspective view of the reactor of FIG. 2, with an arrow showing the general arrangement of a fluid path within the reactor of FIGS. 2 and 3.
Figure 4:
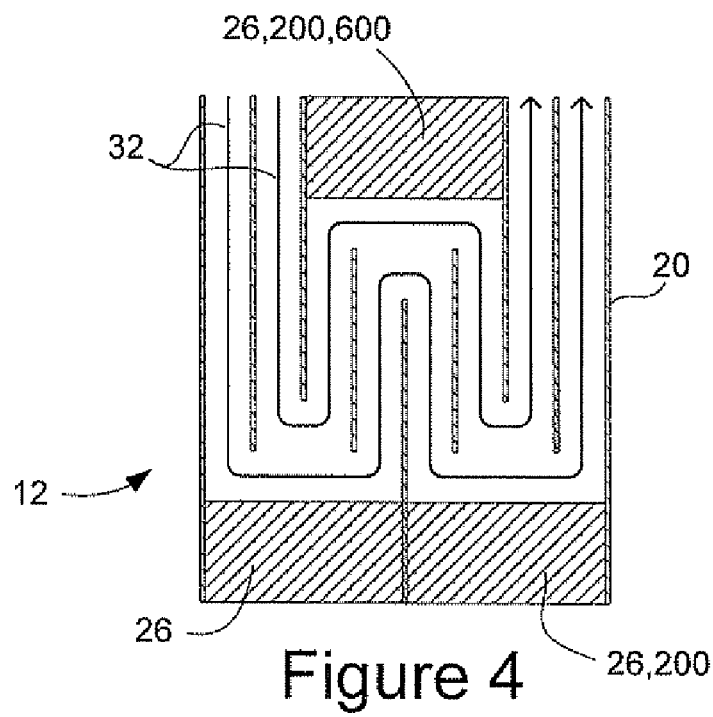
FIG. 4 is a cross-section of a device of the type shown in FIGS. 2 and 3, in which cross section the locations and functions of plugs, desirably formed of materials of the present invention, may be seen.

FIGS. 2-4 show another type of microreactor device 12, sometimes also referred to as a "minireactor" 12. Minireactor 12 shown in FIGS. 2-4 is formed generally within an extruded body 20. Extruded body 20 has multiple cells 22, 24 extending along a common direction, some of which are open cells 22 and some of which are closed cells 24. Closed cells 24 are closed by a more-or-less individual or continuous plug or plug material 26. In the embodiment shown, the plug material 26 has two openings 30 therethrough, each serving as an input/output port. A fluid passage or fluidic path 32 is provided in the closed cells 24 in the form of a serpentine path 32 that follows first along one or a few of the closed cells 24, than along another one or a few, and so back and forth as shown by the arrow in FIG. 3. A detailed cross-sectional view of a portion of a small device similar to the one in FIGS. 2-3 is shown in FIG. 4. Plugs or plug material 26 are used to close of groups of passages from the outside, while walls between these groups are reduced, allowing fluids to flow along the generally serpentine fluidic path 32.

In devices 12 of the type shown in FIGS. 2-4, the extruded body may beneficially be formed of alpha alumina (aluminum oxide), and the plugs or plug material 26 may advantageously take the form of sintered frit 200 of the glass of the present invention, or the composite 600 of the present invention described below in connection with FIG. 6.

Similarly, in accordance with the invention, in making microreactors of the type shown in FIGS. 1A-1D, it is preferred that the substrate be made of alpha alumina, such as COORSTEK 96% (CoorsTek, Golden Colo. USA) having a CTE of $68 \times 10^{-7}/°$ C. at 300° C. Accordingly, in accordance with the invention the desired glass material used to make frit should be a moderate thermal expansion material. For economical processing on standard industrial equipment, the glass material should also have a softening point temperature that does not exceed 900° C., desirably not exceeding 850° C. The material should also have high crystallization resistance in order to insure fill densification and good strength; and should have a high chemical resistance to acids and alkalis, the higher the better. The zirconium- and alumina-containing silicate glass compositions according to the invention satisfy these criteria.

The glasses of the present invention have a composition in mole percent (mol %) of:

$2 < B_2O_3 < 7$ mol %
$75 < SiO_2 < 80$ mol %
$3 < Al_2O_3 < 5$ mol %
$2 < ZrO_2 < 5$ mol %
$9 < Na_2O + K_2O < 15$ mol %, and
$0 <$ alkali earth+lanthanide$< 15$ mol %

The inventive glasses further have the total mole percent of $SiO_2$, $Al_2O_3$ and $ZrO_2$ together greater than 82 but less than 86, and the total mole percent of $B_2O_3$, $Na_2O$, $K_2O$, alkali earths and lanthanides together greater than 13 but less than 18. The invention is directed to this material and to frits, including composites, and to fluidic devices made therefrom.

Glass materials described in the present invention were prepared from silica, boric acid, calcined alumina, zircon, and alkali carbonates. After mixing, the vitrifiable mixture was melted in an induction furnace at 1650° C. for 6 hours into a platinum-rhodium crucible. Then, the melted glasses were quenched in water and milled in dry conditions employing an alumina ball mill. The ball-milled powder was then sieved (<125 μm), yielding a particle size distribution of d10=8 μm; d50=71 μm; and d90=185 μm, and samples were prepared from the sieved powder by pressing powder or molding a frit paste onto an alumina substrate. The samples were then heated at 900° C. for one hour.

The crystallization resistance of bulk glasses was tested by heat treatment of a polished bulk sample for 48 hours at softening point temperature, followed by manual inspection and rating.

Thermal expansion was measured by TMA (thermal mechanical analysis). Thermal expansion was adjusted according to sign and degree of curvature of calibrated bilame coupons after cooling. Seal stresses were examined at room and high temperature via photoelastic techniques.

Softening point temperatures of the glasses were measured via the Labino method. A correction of +25° C. was applied to the raw data to obtain the values in TABLE I, which values represent the real value of softening point (as confirmed by fiber elongation). Data for six comparative glasses C1-C6 and inventive glasses I1 and I2 are shown.

TABLE I

| Comp. | C1 | C2 | C3 | C4 | C5 | C6 | I1 | I2 | units |
|---|---|---|---|---|---|---|---|---|---|
| $SiO_2$ | 78.1 | 79.7 | 79.9 | 76.5 | 76.5 | 76.32 | 76.5 | 76.5 | % mol |
| $B_2O_3$ |  | 1.35 | 1.52 | 5.3 | 5.3 | 7.57 | 5.3 | 3.2 |  |
| $Al_2O_3$ |  |  |  | 2.0 | 3.74 | 3.0 | 3.0 |  |  |
| $Li_2O$ | 2.18 | 2.25 | 1.81 |  |  |  |  |  |  |
| $Na_2O$ | 12.6 | 11.4 | 11.7 | 12.3 | 12.3 | 9.74 | 12.3 | 14.4 |  |
| $K_2O$ |  |  |  |  |  | 0.67 |  |  |  |
| $ZrO_2$ | 8.4 | 5.3 | 5.1 | 5.9 | 3.9 |  | 2.9 | 2.9 |  |
| CaO |  |  |  |  |  | 1.13 |  |  |  |
| BaO |  |  |  |  |  | 0.83 |  |  |  |
| Prop. |  |  |  |  |  |  |  |  |  |
| CTE @ 300 | 60.8 | 58.7 | 58.3 | 57.0 | 57.6 | 59.2 | 59.0 | 63.7 | $\times 10^{-7}/°$ C. |
| Soften. Point | 873 | 818 | 819 | 853 | 829 | 781 | 823 | 813 | ° C. |
| Tg |  | 576 | 581 | 641 | 627 | 583 | 618 | 597 | ° C. |
| Devit. Resist. | fair | bad | bad | fair | excellent | fair | excellent | excellent | rating |
| DIN 12116 | 0.6 | <0.1 | <0.1 | 0.3 | 0.2 | 0.3 |  | <0.1 | mg/dm$^2$ |
| ISO 695 | 10 | 11 | 11 | 13 | 20 | 77 |  | 27 | mg/dm$^2$ |
| density |  |  |  |  |  |  | 2.44 | 2.47 | g/cc |

Chemical durability was determined by measuring weight loss of samples immersed in acid or alkaline media in accordance with ISO 12116 (acid), and ISO 695 (alkali).

Glasses of the present invention have excellent chemical resistance. It is desirable that they have acidic durability of less than 10 mg/dm$^2$ lost in testing under DIN 12116, more desirably less than 1 mg/dm$^2$ lost. Further, it is desirable that these glasses have a alkali durability of at less than 100 mg/dm$^2$ lost in testing under ISO 695, more desirably less than 30 mg/dm$^2$ lost. Performance of glass I2 in Table I actually equals acidic durability of PYREX® 7740 at <0,1 mg/dm$^2$ and well exceeds its alkali durability (of 110 mg/dm2) at 27 mg/dm$^2$. Despite presence of large amount of sodium oxide in the composition, the inventive glasses keep excellent acidic resistance (Class 1) and surprisingly exceptional alkali resistance (Class A1).

High levels of silica along with presence of alumina and significant level of zirconia (Si+Al+Zr>82%) in the glass composition are likely the origin of such outstanding performance. Zirconium oxide is recognized to give good base durability in silicates without seriously sacrificing acid durability. A decrease of alkali resistance of glass is noted for comparative composition C6 in which zirconium oxide is not present.

High levels of refractory oxides can make a glass impossible to melt in typical industrial equipment. Therefore, the presence of sufficient level of fluxing components is desirable to ensure good meltability of the glass and to keep viscosity at an acceptable level (i.e., to keep the softening point temperature less than 900° C., and desirably less than 850° C.). In order to satisfy this requirement, the sum of boron, sodium and potassium together should be above 13%. However, excessive amounts (greater than 18%) make the glass less durable. Moreover, a substantial (desirable) decrease of glass viscosity has been observed when part of zirconium was replaced by aluminum, as seen from comparison of comparative example C4 versus comparative example C5. Alkaline earth and/or lanthanide elements may also be introduced advantageously to lower glass viscosity, provided that their sum does not exceed 15%.

Figure 5:
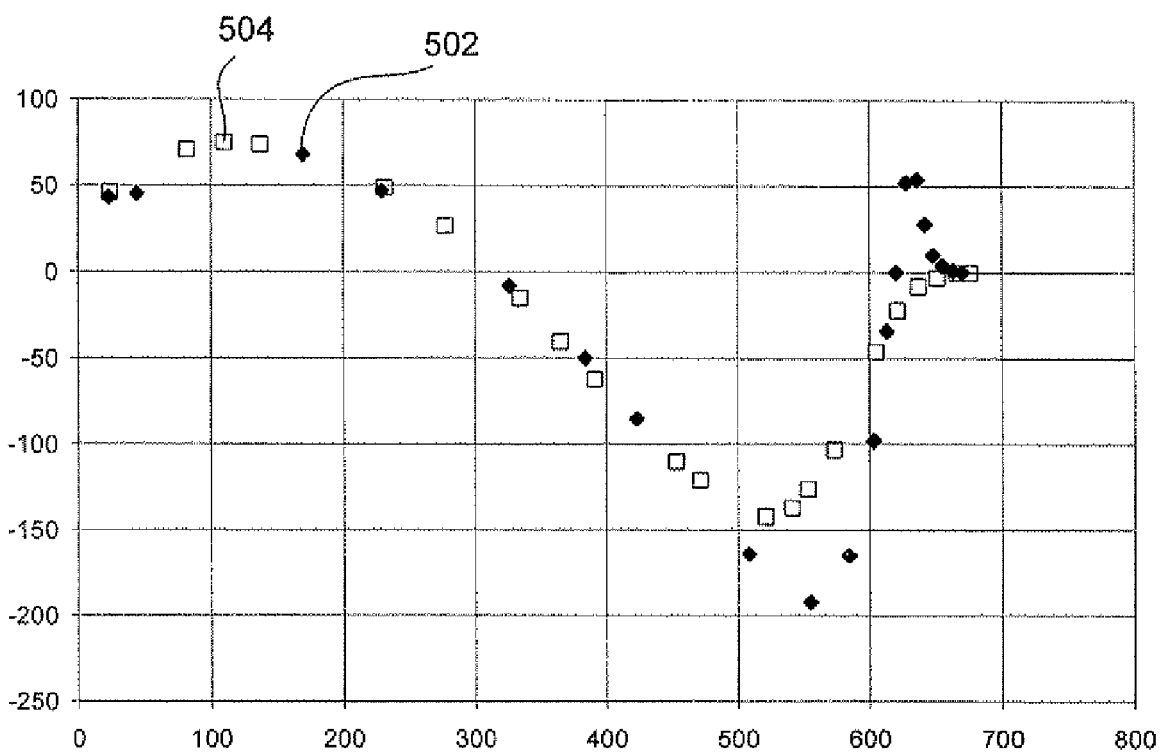
FIG. 5 is a plot of thermal expansion mismatch, in parts per million, between the glass I2 of TABLE I and 96% alumina, as a function of temperature in degrees C.

Keeping other glass properties unchanged, the thermal expansion of the glass of the present invention can generally be adjusted by varying the content of sodium and boron. A high level of silica (above 75%) is necessary to ensure glass durability, but silica should not exceed 80% since silica at such levels lowers the thermal expansion unacceptably. The CTE of the currently preferred glass composition I2 is essentially perfectly matched to that of the alumina ceramic employed (COORSTEK 96%) with about 50 ppm mismatch at room temperature. Dynamic mismatch over temperature was recorded for a butt seal, and the results in parts per million are graphed in FIG. 5 as a function of temperature in ° C. The curve during heating is plotted in closed diamonds 502 while the curve during cooling is plotted in open squares 504.

Frits of glasses of the present invention can be mixed with alumina particles to produce thermally conductive glass composite. During firing of with admixed alumina powder, the glass matrix properly wets the surface of the alumina particles. This is an important characteristic for making a glass composite with low interfacial resistance. A thin diffusion layer of 100-200 nm is actually formed at the glass/particle interface, This diffusion layer may be observed in a photomicrograph after etching of a polished sample by diluted Hydrofluoric acid solution. FIG. 6 is a contrast-enhanced micrograph of such an etched polished sample of a composite 600 of the present invention. A particle of alumina 602 can be seen well-embedded in the glass matrix 604. That the particle 602 is well wetted by the glass may be seen from the extreme uniformity (in thickness) and extreme thinness of the diffusion layer 606 between the particle 602 and the matrix 604.

Figure 6:
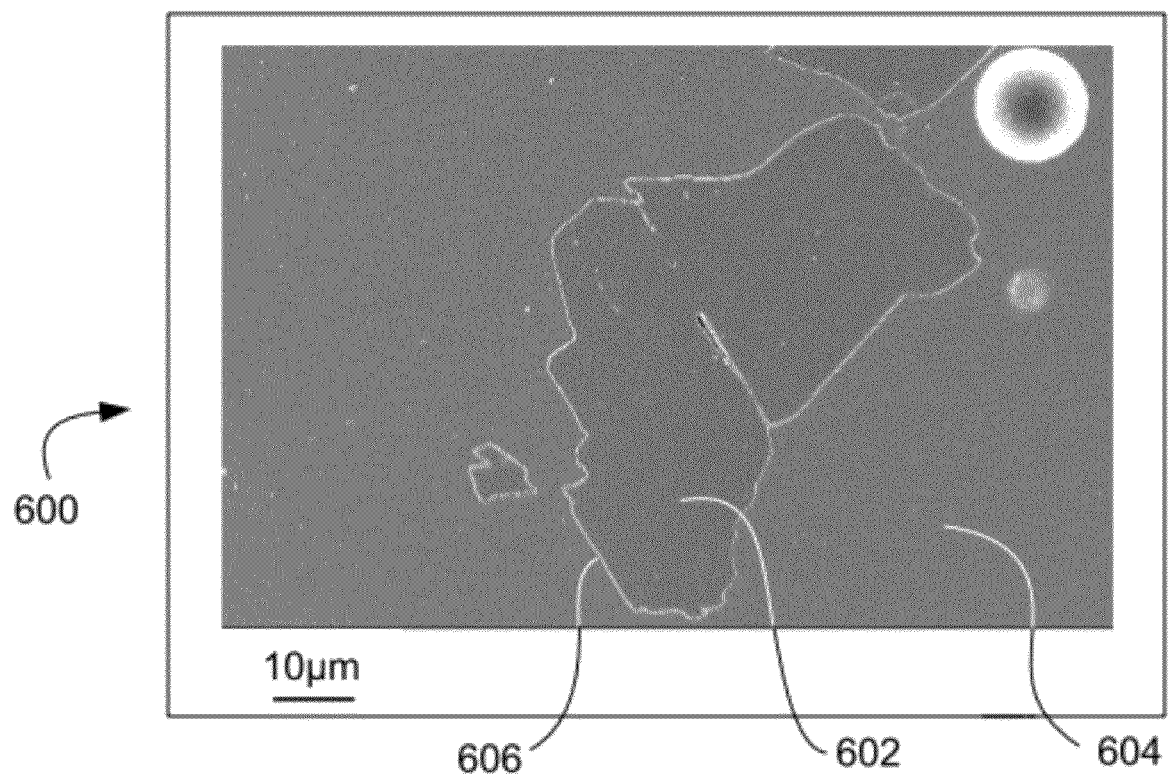
FIG. 6 is a micrograph of a polished and etched sample of a composite according to the present invention, showing extremely good wetting of alumina particles by the glass matrix, and showing a thin diffusion layer of 100-200 nm thickness at the glass/particle interface.

A filled glass composite like that shown in the micrograph of FIG. 6 was produced with a measured thermal conductivity of 2.2 W/m K. For this composite, 30% by volume of alumina particles (150 mesh) were added to the glass frit. Overall heat transfer coefficient of an alumina microreactor made with such filled frit was increased by a factor of two compared with the equivalent glass device component, from about 700 W/m²K to about 1400. The present invention is directed also to such composites and to microfluidic devices comprising the inventive glasses or composites.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A crystallization-resistant zirconium- and alumina-containing silicate glass for use as a frit with refractory materials such as alumina, the glass comprising a composition in mole percent (mol %) of:

$2<B_2O_3<7$ mol %
$75<SiO_2<80$ mol %
$3<Al_2O_3<5$ mol %
$2<ZrO_2<5$ mol %
$9<Na_2O+K_2O<15$ mol %
$0<$ alkali earth+lanthanide$\leq 1.96$ mol % and wherein the total mole percent of $SiO_2$, $Al_2O_3$ and $ZrO_2$ together is greater than 82 but less than 86, and wherein the total mole percent of $B_2O_3$, $Na_2O$, $K_2O$, alkali earths and lanthanides together is greater than 13 and less than 18.

2. The glass according to claim 1 wherein the glass has a softening point of less than 900° C. and loses less than 10 mg/dm² under DIN 12116 acid resistance testing and loses less than less than 100 mg/dm2 under ISO 695 base resistance testing.

3. The glass according to claim 1 wherein the glass loses less than 30 mg/dm² under ISO 695 base resistance testing.

4. The glass according to claim 1 wherein the glass has a softening point of less than 850° C.

5. The glass according to claim 1, wherein the glass comprises:

$B_2O_3=3.2\pm 1.1$ mol %
$SiO_2=76.5\pm 1.4$ mol %
$Al_2O_3=3.1-4$ mol %
$ZrO_2=2.9\pm 0.8$ mol %
$Na_2O=14.4\pm 0.5$ mol %.

6. The glass according to claim 1, wherein the glass comprises:

$B_2O_3=3.2\pm 0.3$ mol %
$SiO_2=76.5\pm 0.7$ mol %
$Al_2O_3=3.1-3.4$ mol %
$ZrO_2=2.9\pm 0.3$ mol %
$Na_2O=14.4\pm 0.4$ mol %.

7. A glass frit comprising the glass according to claim 1.

8. A microfluidic (12) device including walls (202b) comprising a glass frit, the frit comprising the glass according to claim 1.

9. A microfluidic device (12) comprising a sintered frit (200, 600); a first substrate (102); and a second substrate (104); the sintered frit (200,600), the first substrate (102) and the second substrate (104) being adhered together to form a one-piece device (12) in which the sintered frit (200,600) defines at least one recess (250) between the first and second substrates (102,104), wherein the sintered frit (200,600) comprises a crystallization-resistant zirconium- and alumina-containing silicate glass comprising in mole percent (mol %) of:

$2<B_2O_3<7$ mol %
$75<SiO_2<80$ mol %
$3<Al_2O_3<5$ mol %
$2<ZrO_2<5$ mol %
$9<Na_2O+K_2O<15$ mol %
$0<$ alkali earth+lanthanide$\leq 1.96$ mol % and wherein the total mole percent of $SiO_2$, $Al_2O_3$ and $ZrO_2$ together is greater than 82 but less than 86, and wherein the total mole percent of $B_2O_3$, $Na_2O$, $K_2O$, alkali earths and lanthanides together is greater than 13 and less than 18.

10. The microfluidic device (12) according to claim 9 wherein the silicate glass has a softening point of less than 850° C. and loses less than 10 mg/dm² under DIN 12116 acid resistance testing and loses less than less than 100 mg/dm2 under ISO 695 base resistance testing, and wherein the sintered frit has a crystallization layer of 10 μm or less after sintering in contact with alpha alumina.

11. The microfluidic device (12) according to claim 9 wherein said first substrate (102) comprises alpha alumina.

12. The microfluidic device according to claim 9 wherein said sintered frit (200,600) further comprises alpha-alumina particles.

13. The microfluidic device according to claim 9 wherein said silicate glass loses less than 1 mg/dm² under DIN 12116 acid resistance testing.

14. The microfluidic device according to claim 9 wherein said silicate glass loses less than 30 mg/dm2 under ISO 695 base resistance testing.

15. A microfluidic device (12) comprising a extruded body (20) with cells (22,24) extending along a common direction therein, the extruded body (20) having a fluidic path (32) defined therein in part by a plug material (26) closing off selected of the cells (24) of the extruded body (20), the plug material (26) comprising a sintered frit (200,600), the frit (200,600) comprising a crystallization-resistant zirconium- and alumina-containing silicate glass comprising in mole percent (mol %) of:

2<$B_2O_3$<7 mol %
75<$SiO_2$<80 mol %
3<$Al_2O_3$<5 mol %
2<$ZrO_2$<5 mol %
9<$Na_2O+K_2O$<15 mol %
0<alkali earth+lanthanide≦1.96 mol % and wherein the total mole percent of $SiO_2$, $Al_2O_3$ and $ZrO_2$ together is greater than 82 but less than 86, and wherein the total mole percent of $B_2O_3$, $Na_2O$, $K_2O$, alkali earths and lanthanides together is greater than 13 and less than 18.

16. The microfluidic device (12) according to claim 15 wherein the silicate glass has a softening point of less than 850° C. and loses less than 10 mg/dm² under DIN 12116 acid resistance testing and loses less than less than 100 mg/dm² under ISO 695 base resistance testing, and wherein the sintered frit has a crystallization layer of 10 μm or less after sintering in contact with alpha alumina.

17. The microfluidic device (12) according to claim 15 wherein said extruded body (20) comprises alpha alumina.

18. The microfluidic device (12) according to claim 15 wherein said silicate glass loses less than 1 mg/dm² under DIN 12116 acid resistance testing.

19. The microfluidic device (12) according to claim 15 wherein said silicate glass loses less than 30 mg/dm² under ISO 695 base resistance testing.

20. A composite material (600) comprising alpha alumina particles and a frit according to claim 7, wherein the frit is sintered and the particles are embedded in the sintered frit.

* * * * *